United States Patent
Yamazaki et al.

(10) Patent No.: US 7,195,990 B2
(45) Date of Patent: Mar. 27, 2007

(54) PROCESS FOR PRODUCING A PHOTOELECTRIC CONVERSION DEVICE THAT INCLUDES USING A GETTERING PROCESS

(75) Inventors: Shunpei Yamazaki, Setagaya (JP); Yasuyuki Arai, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/733,352

(22) Filed: Dec. 12, 2003

(65) Prior Publication Data

US 2004/0121530 A1 Jun. 24, 2004

Related U.S. Application Data

(62) Division of application No. 10/056,108, filed on Jan. 28, 2002, now Pat. No. 6,686,262.

(30) Foreign Application Priority Data

Jan. 30, 2001 (JP) .............................. 2001-022471

(51) Int. Cl.
*H01L 21/322* (2006.01)
(52) U.S. Cl. ............................... 438/471; 257/E21.318
(58) Field of Classification Search ................ 438/143, 438/149, 310, 311, 471, 482, 488, 761–765, 438/778, 417; 257/E21.318
See application file for complete search history.

(56) References Cited

U.S. PATENT DOCUMENTS 3,535,775 A 10/1970 Garfinkel et al.
4,371,403 A 2/1983 Ikubo et al.
4,477,308 A 10/1984 Gibson et al.
4,534,820 A 8/1985 Mori et al.
4,727,044 A 2/1988 Yamazaki
5,244,819 A 9/1993 Yue
5,248,630 A 9/1993 Serikawa et al.
5,275,896 A 1/1994 Garofalo et al.
5,403,772 A 4/1995 Zhang et al.

(Continued)

FOREIGN PATENT DOCUMENTS

EP 0 651 431 5/1995

(Continued)

OTHER PUBLICATIONS

K.S. Jones et al., *Boron Diffusion upon Annealing of Laser Thermal Processed Silicon*, Ion Implantation Technology 2000, IEEE, 2000, pp. 111-114.

(Continued)

*Primary Examiner*—Michael Lebentritt
*Assistant Examiner*—Stanetta Isaac
(74) *Attorney, Agent, or Firm*—Eric J. Robinson; Robinson Intellectual Property Law Office, P.C.

(57) ABSTRACT

A catalyst element remaining in a first semiconductor film subjected to a first heat treatment (crystallization) is moved and concentrated/collected by subjecting a second semiconductor film which is formed on the first semiconductor film and contains a rare gas element to a second heat treatment. That is, the rare gas element is incorporated into the second semiconductor film to generate a strain field as a gettering site.

39 Claims, 6 Drawing Sheets

U.S. PATENT DOCUMENTS

| | | |
|---|---|---|
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,551,984 A | 9/1996 | Tanahashi |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,773,327 A | 6/1998 | Yamazaki et al. |
| 5,789,284 A * | 8/1998 | Yamazaki et al. .......... 438/166 |
| 5,814,540 A | 9/1998 | Takemura et al. |
| 5,837,569 A | 11/1998 | Makita et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,960,252 A | 9/1999 | Matsuki et al. |
| 5,961,743 A | 10/1999 | Yamazaki et al. |
| 5,970,327 A | 10/1999 | Makita et al. |
| 5,977,559 A | 11/1999 | Zhang et al. |
| 5,985,740 A | 11/1999 | Yamazaki et al. |
| 5,997,286 A | 12/1999 | Hemsath et al. |
| 5,998,838 A | 12/1999 | Tanabe et al. |
| 6,013,544 A | 1/2000 | Makita et al. |
| 6,015,593 A | 1/2000 | Yonkoski et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A * | 7/2000 | Henley et al. .............. 148/33.2 |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,168,981 B1 | 1/2001 | Battaglia et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,287,988 B1 | 9/2001 | Nagamine et al. |
| 6,291,275 B1 | 9/2001 | Yamazaki et al. |
| 6,291,888 B1 * | 9/2001 | Bhat et al. .................. 257/758 |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,331,457 B1 | 12/2001 | Yamazaki et al. |
| 6,337,259 B1 * | 1/2002 | Ueda et al. ................. 438/471 |
| 6,346,730 B1 | 2/2002 | Kitakado et al. |
| 6,362,507 B1 | 3/2002 | Ogawa et al. |
| 6,376,336 B1 | 4/2002 | Buynoski |
| 6,391,690 B2 | 5/2002 | Miyasaka |
| 6,396,147 B1 | 5/2002 | Adachi et al. |
| 6,399,454 B1 | 6/2002 | Yamazaki |
| 6,399,988 B1 | 6/2002 | Yamazaki |
| 6,420,758 B1 | 7/2002 | Nakajima |
| 6,426,276 B1 | 7/2002 | Ohnuma et al. |
| 6,429,097 B1 | 8/2002 | Voutsas et al. |
| 6,436,745 B1 * | 8/2002 | Gotou et al. ................ 438/166 |
| 6,444,534 B1 * | 9/2002 | Maszara ..................... 438/311 |
| 6,461,943 B1 | 10/2002 | Yamazaki et al. |
| 6,489,189 B2 | 12/2002 | Yamazaki et al. |
| 6,512,504 B1 | 1/2003 | Yamauchi et al. |
| 6,531,713 B1 | 3/2003 | Yamazaki |

| | | |
|---|---|---|
| 6,534,826 B2 | 3/2003 | Yamazaki |
| 6,541,294 B1 | 4/2003 | Yamazaki et al. |
| 6,576,926 B1 | 6/2003 | Yamazaki et al. |
| 6,579,736 B2 | 6/2003 | Yamazaki |
| 6,670,259 B1 * | 12/2003 | Chan .......................... 438/473 |
| 6,680,577 B1 | 1/2004 | Inukai et al. |
| 6,709,902 B2 | 3/2004 | Kitakado et al. |
| 6,737,304 B2 | 5/2004 | Yamazaki et al. |
| 6,743,649 B2 | 6/2004 | Yamazaki et al. |
| 6,808,968 B2 | 10/2004 | Takayama et al. |
| 6,913,956 B2 | 7/2005 | Hamada et al. |
| 2001/0034088 A1 | 10/2001 | Nakamura et al. |
| 2002/0028543 A1 | 3/2002 | Yamazaki et al. |
| 2002/0086469 A1 | 7/2002 | Kim et al. |
| 2002/0098628 A1 | 7/2002 | Hamada et al. |
| 2002/0102764 A1 | 8/2002 | Yamazaki et al. |
| 2002/0106861 A1 | 8/2002 | Yamazaki |
| 2002/0115271 A1 | 8/2002 | Yamazaki et al. |
| 2002/0125480 A1 | 9/2002 | Nakamura et al. |
| 2002/0134981 A1 | 9/2002 | Nakamura et al. |
| 2002/0142554 A1 | 10/2002 | Nakajima |
| 2002/0151120 A1 | 10/2002 | Yamazaki et al. |
| 2002/0151154 A1 | 10/2002 | Yamazaki et al. |
| 2002/0164843 A1 | 11/2002 | Yamazaki et al. |
| 2002/0182783 A1 | 12/2002 | Takayama et al. |
| 2002/0187594 A1 | 12/2002 | Yamazaki et al. |
| 2002/0197785 A1 | 12/2002 | Yamazaki et al. |
| 2003/0060057 A1 | 3/2003 | Raaijmakers et al. |
| 2003/0062499 A1 | 4/2003 | Yamazaki |
| 2003/0122129 A1 | 7/2003 | Yamazaki et al. |
| 2003/0132900 A1 | 7/2003 | Yamauchi et al. |
| 2003/0197179 A1 | 10/2003 | Yamazaki et al. |
| 2004/0065902 A1 | 4/2004 | Yamazaki et al. |

FOREIGN PATENT DOCUMENTS

| | | |
|---|---|---|
| JP | 05-109737 | 4/1993 |
| JP | 06-151414 | 5/1994 |
| JP | 07-058338 | 3/1995 |
| JP | 07-130652 | 5/1995 |
| JP | 07-183540 | 7/1995 |
| JP | 08-078329 | 3/1996 |
| JP | 09-074207 | 3/1997 |
| JP | 10-055951 | 2/1998 |
| JP | 2000-105081 | 4/2000 |
| JP | 3032801 | 4/2000 |
| JP | 2000-260777 | 9/2000 |
| JP | 2001-210828 | 8/2001 |
| JP | 2001-267264 | 9/2001 |

OTHER PUBLICATIONS

L.S. Lee et al., *Argon Ion-Implantation on Polysilicon or Amorphous-Silicon for Boron Penetration Suppression in p+ p MOSFET*, IEEE Transactions on Electron Devices, vol. 45, No. 8, Aug. 1998, pp. 1737-1744.

D.J. Llewellyn et al., *Implantation and Annealing of Cu in InP for electrical isolation: microstructural characterisation*, IEEE Electron Devices Letters, Jan. 1, 1997, pp. 313-316.

M. Miyake et al., *Characteristics of Buried-Channel pMOS Devices with Shallow Counter-Doped Layers Fabricated Using Channel Preamorphization*, IEEE Transactions on Electron Devices, vol. 43, No. 3, Mar. 1996, pp. 444-449.

Specification, claims, abstract of U.S. Appl. No. 08/784,293 filed Jan. 16, 1997 to Yamazaki et al.

* cited by examiner

US 7,195,990 B2

PROCESS FOR PRODUCING A PHOTOELECTRIC CONVERSION DEVICE THAT INCLUDES USING A GETTERING PROCESS

BACKGROUND OF THE INVENTION

1. Field of the Invention

The present invention relates to a photoelectric conversion device wherein a photoelectric conversion layer composed of a crystalline silicon film is formed on a substrate, and a process for producing the same.

2. Related Art

A photoelectric conversion device can be produced using any one of various semiconductor materials and organic compound materials. However, the photoelectric conversion device is industrially produced using silicon mainly. The photoelectric conversion device using silicon can be classified into a bulk type photoelectric conversion device using a wafer made of monocrystal silicon or polycrystal silicon and a thin film type photoelectric conversion device wherein a silicon film is formed on a substrate. For the bulk type photoelectric conversion device, a semiconductor substrate (such as a silicon wafer) is necessary in the same way as for a LSI (large-scale integrated circuit). The production amount thereof is limited by the supply capacity of the semiconductor substrate. On the other hand, it is considered that potential production capacity of the thin film type photoelectric conversion device is higher because of the use of a semiconductor film on a given substrate.

At present, a photoelectric conversion device using amorphous silicon is made practicable. However, this photoelectric conversion device has lower conversion efficiency than the photoelectric conversion device using monocrystal silicon or polycrystal silicon. Furthermore, this photoelectric conversion device has problems such as deterioration by light. Thus, the use of this photoelectric conversion device is limited to products having a small power consumption, such as a pocket calculator. For sunshine power generation, photoelectric conversion devices using a silicon film obtained by crystallizing an amorphous silicon film (the obtained silicon film being referred to as a crystalline silicon film hereinafter) have been actively developed.

The method of forming the crystalline silicon film is classified into melting recrystallization and solid phase growth methods. In both the methods, amorphous silicon is formed on a substrate, and this silicon is recrystallized to form a crystalline silicon film. In either case, the substrate is required to endure the crystallization temperature of silicon. Thus, the material which can be used for the substrate is limited. Particularly in the melting recrystallization method, the material for the substrate is limited to a material enduring the melting point of silicon, that is, 1412° C.

The solid phase method is a method of forming an amorphous silicon film on a substrate and then subjecting the film to heat treatment to crystalline the film. Usually, the amorphous silicon film is hardly crystallized at a temperature of 500° C. or lower. Practically, it is necessary to heat the amorphous silicon film at 600° C. or higher. For example, in the case that an amorphous silicon film formed by a vapor growth method is heated to be crystallized, a heating time of 10 hours is necessary when heating temperature is 600° C. When the heating temperature is 550° C., a heating time of 100 hours or more is necessary.

For the reasons as described above, the substrate for forming a crystalline silicon film is required to have high heat-resistance. It is therefore preferred to use quartz, carbon, a ceramic material or the like as the material for the substrate. However, such a substrate is not necessarily suitable for a reduction in production costs. It would be primarily desired that an inexpensive material circulated in a great amount in the market is used as the material for the substrate. However, for example, a #7059 glass substrate made by Corning Incorporated, which is in general frequently used, has a strain point of 593° C. Thus, if a conventional crystallizing technique is used, this substrate is distorted to generate large deformation. Therefore, the substrate is not used. Since the substrate is made of a material essentially different from silicon, a monocrystal film cannot be obtained even if heat treatment for crystallization is merely performed. As a result, only a polycrystal film can be obtained. The grain size of the polycrystal film is not easily made large. This fact results in the suppression of an improvement in the efficiency of photoelectric conversion device.

As a method for solving the above-mentioned problems, JP-A-7-58338 discloses a technique wherein a very small amount of a catalyst element is added as a catalyst material for the promotion of crystallization at low temperature, thereby attaining the crystallization. According to this official gazette open to the public, it becomes possible to make heat treatment temperature low and make treatment time short. For example, in the case that the heating temperature is set to 550° C., it is verified that silicon is crystallized by heat treatment for 4 hours. The official gazette states that a single element of nickel (Ni), iron (Fe), cobalt (Co) or platinum (Pt), a compound of any one of them and silicon, or the like is suitable for the catalyst element.

Originally, however, all of the catalyst materials used to promote the crystallization are materials unpreferable for crystalline silicon. It is therefore desired that the concentration of the catalyst material is as low as possible after the crystallization. The concentration of the catalyst material necessary for promoting the crystallization is a range from $1 \times 10^{17}$ to $1 \times 10^{20}/cm^3$. However, even if the concentration is relatively low, the element suitable for the catalyst material, when taken in silicon, generates a defect level because the element is a metal. Thus, it is evident that this defect level causes the deterioration of important characteristics for a photoelectric conversion device, such as the lifetime of carriers.

Incidentally, it can be considered that the outline of the action principle of a photoelectric conversion device produced by forming a PN junction is as follows. The photoelectric conversion device absorbs light, and generates carriers (i.e., electrons and holes) by the energy of the absorbed light. About the generated carriers, the electrons move toward its n layer and the holes move toward its p layer by drift and diffusion based on an electric field. In the case that silicon has many defect levels, the carriers are trapped into the defect levels on their way to become extinct. That is, the photoelectric conversion characteristic of the photoelectric conversion device deteriorates. The time from the generation of the electrons and holes to the extinction thereof is called a lifetime. It is desired that this value is larger for the photoelectric conversion device. Therefore, it is necessary that the amount of impurity elements, which generate the defect level in silicon, are originally as small as possible.

SUMMARY OF THE INVENTION

An object of the present invention is to provide a photoelectric conversion device wherein good use is made of the advantage of the crystallization of silicon resulting from the above-mentioned catalyst material and further the catalyst material which is unnecessary after the crystallization is removed to exhibit a superior photoelectric conversion characteristic.

In order to solve the above-mentioned problems, the process for producing a photoelectric conversion device of the present invention comprises the steps of generating, for a semiconductor film having a crystal structure formed by adding a catalyst element for promoting crystallization to a semiconductor film having an amorphous structure, a strain field by means of a semiconductor film to which a rare gas is added or a semiconductor region to which a rare gas is added, as a means for removing the catalyst element remaining in the semiconductor film having the crystal structure; and using the strain field as a gettering site to segregate the catalyst element into this region.

That is, the process for producing a photoelectric conversion device of the present invention comprises the steps of forming a first semiconductor film having an amorphous structure; adding a catalyst element for promoting crystallization to the first semiconductor film having the amorphous structure; conducting a first heat treatment to form a first semiconductor film having a crystal structure; forming a second semiconductor film containing a rare gas element on the first semiconductor film having the crystal structure; conducting a second heat treatment to segregate the catalyst element into the second semiconductor film; and removing the second semiconductor film.

By adding, to the first semiconductor film having the amorphous structure, the catalyst element for promoting the crystallization thereof and then subjecting the resultant semiconductor film to the first heat treatment, heating temperature necessary for the crystallization can be made lower than in the prior art. The catalyst element(s) that can be used is/are one or more selected from Fe, Ni, Co, Ru, Rh, Pd, Os, Ir, Pt, Cu and Au.

The catalyst element remaining in the first semiconductor film after the crystallization can be moved into the second semiconductor film and concentrated/collected by forming the second semiconductor film containing the rare gas element on the first semiconductor film and then conducting the second heat treatment. That is, by incorporating the rare gas element into the second semiconductor film, a strain field can be generated so as to be a gettering site. Since the rare gas element is not basically bonded to another atom, the rare gas element is inserted between lattices in the semiconductor film, thereby generating the strain field.

The gettering technique is well known as a technique for producing an integrated circuit using a silicon monocrystal substrate. As the gettering technique, the following are known: extrinsic gettering, wherein a strain field or a chemical effect is supplied to a silicon substrate from the outside so as to generate gettering effect; and intrinsic gettering, wherein a strain field based on lattice defects with which oxygen generated inside a wafer is concerned is used. Examples of the extrinsic gettering include a method of giving mechanical damage to the back face (that is, the face opposite to the face on which elements are to be formed) of a silicon substrate, and a method of forming a polycrystal silicon film, and a method of diffusing phosphorus. There is also known a gettering technique performed in the state that a strain field is generated by secondary lattice defects formed by ion implantation. The detailed mechanism of the gettering has not been necessarily made clear. However, the following phenomenon is positively used in the mechanism: when heat treatment is conducted as described above, metal elements are precipitated in the region where a strain field is generated.

In order to remove the second semiconductor film formed on the first semiconductor film selectively after the gettering is performed, it is advisable to form a barrier layer on the first semiconductor film. The barrier layer may be formed by treating the first semiconductor film with ozone water to form a chemical oxide, by treating the first semiconductor film with plasma to oxidize the surface thereof, or by radiating ultraviolet rays in an atmosphere containing oxygen to generate ozone and oxidizing the surface with ozone.

The second semiconductor film is formed by sputtering or plasma CVD. A rare gas element can be taken in the second semiconductor film by incorporating the rare gas into the sputtering gas or adding the rare gas to the reaction gas. After the formation of the film, the rare gas may be added by ion implantation or ion doping. As the rare gas, a gas selected from He, Ne, Ar, Kr and Xe is used.

The first heat treatment and the second heat treatment are conducted by rapid thermal annealing (RTA) using a halogen lamp, a metal halide lamp, a xenon arc lamp, a carbon arc lamp, a high-pressure sodium lamp, or a high-pressure mercury lamp as a heating means or by furnace annealing. In the present invention, it is sufficient that the gettering causes the catalyst element to move at a distance corresponding substantially to the thickness of the semiconductor film. Thus, the gettering can be completely accomplished even by short-time heat treatment such as RTA.

According to the present invention, the second semiconductor film wherein a strain field is generated by the addition of a rare gas is used as a gettering site; therefore, the layer at the incident side of light in the photoelectric conversion device can be formed as an n-type semiconductor layer or a p-type semiconductor layer. This makes it possible to select the substrate on which the semiconductor film having a crystal structure is formed from various substrates, and select the layer at the incident side of light freely from both of n-type and p-type semiconductor layers.

PREFERRED EMBODIMENTS OF THE INVENTION

Embodiment 1

Referring to FIG. 1, the following will describe a process for producing a photoelectric conversion device by forming a catalyst element for promoting the crystallization of silicon adhesively to an amorphous silicon film, crystallizing the amorphous silicon film by heat treatment, and removing the catalyst element remaining after the crystallization outside the crystalline silicon film.

Referring to FIG. 1, a silicon oxide film 102 is formed as an undercoat on a glass substrate (for example, a 1737 glass substrate made by Corning Incorporated) 101 to have a thickness of 0.3 µm. This silicon oxide film 102 may be formed by plasma CVD using tetramethyl silicate (TEOS) as raw material, or by sputtering. Next, an amorphous silicon film 103 is formed by plasma CVD using silane gas as raw material.

Figure 1A:
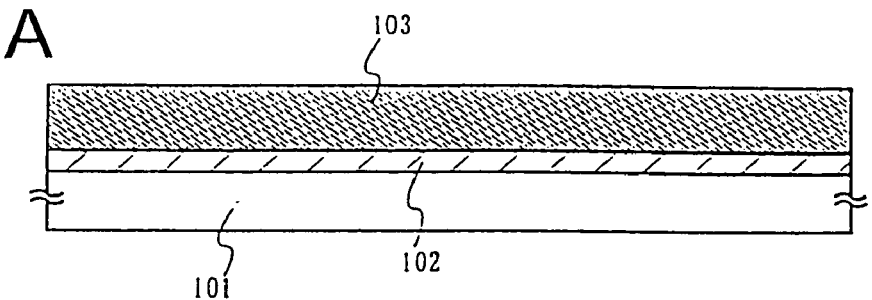
FIGS. 1A to 1D are views which schematically illustrate a process for producing a photoelectric conversion device of the present invention.

The formation of the amorphous silicon film 103 may be performed using reduced-pressure thermal CVD, sputtering or vacuum evaporation as well as plasma CVD. The amorphous silicon film 103 may be an intrinsic amorphous silicon film to which an element of the 13 or 15 group in the periodic table is not intentionally added, or an amorphous silicon film to which 0.001 to 0.1 atomic percent of boron (B) is added. The thickness of the amorphous silicon film 103 is set to 1–20 µm, preferably 5–10 µm (FIG. 1A).

Next, the workpiece is immersed in an aqueous solution wherein hydrogen peroxide water is mixed with ammonia, and is kept at 70° C. for 5 minutes to form an oxidized film (not illustrated) on the surface of the amorphous silicon film 103. This oxidized film is formed to improve the wettability of a solution of nickel acetate in a subsequent step of applying the solution. The nickel acetate solution is applied to the surface of the amorphous silicon film 103 by spin coating. In this way, nickel, which will be a catalyst element, is dispersed onto the surface of the amorphous silicon film 103. When the amorphous silicon film 103 is crystallized, nickel acts as a catalyst for promoting the crystallization.

Next, this workpiece is kept at a temperature of 450° C. in a nitrogen atmosphere for 1 hour to cause hydrogen in the amorphous silicon film 103 to be released. This is performed to lower the threshold energy for subsequent crystallization by forming dangling bonds (unpaired bonding hands) intentionally in the amorphous silicon film 103. Thereafter, the workpiece is subjected to heat treatment at 500 to 600° C., preferably at 550° C., in the nitrogen atmosphere for 4 to 8 hours, so as to crystallize the amorphous silicon film 103. In this way, a crystalline silicon film 104 is formed. Because of the catalyst action of nickel, the temperature for this crystallization can be made to 550° C. This crystalline silicon film 104 contains 0.001 to 5 atomic percentage of hydrogen. During the above-mentioned heat treatment, nickel diffuses into silicon so as to form a silicide. In this way, the crystallization of silicon advances.

As the method of the heat treatment, there is adopted an RTA method using a halogen lamp, a metal halide lamp, a xenon arc lamp, a carbon arc lamp, a high-pressure sodium lamp, a high-pressure mercury lamp or the like. In the case of performing the RTA method, a heating lamp source is lighted for 1 to 60 seconds, preferably 30 to 60 seconds. This is repeated 1 to 10 times, preferably 2 to 6 times. The emission intensity of the lamp source may be freely decided; however, the intensity is set in such a manner that the semiconductor film is instantaneously heated up to 600 to 1000° C., preferably 650 to 750° C. Even if such a high temperature is instantaneously realized, the semiconductor film can be preferentially heated by selecting the kind of the lamp source to make the wavelength band of the electromagnetic wave radiated therefrom to an appropriate wavelength band (that is, a wavelength band which is sufficiently absorbed in the semiconductor film). Accordingly, the substrate 101 itself is not distorted or deformed. For example, a halogen lamp having a spectrum peak in a band of wavelengths over 600 nm is suitable for heating the amorphous silicon film. By crystallizing the semiconductor film having the amorphous structure in this way, the crystalline silicon film 104 can be obtained as well.

Figure 1B:
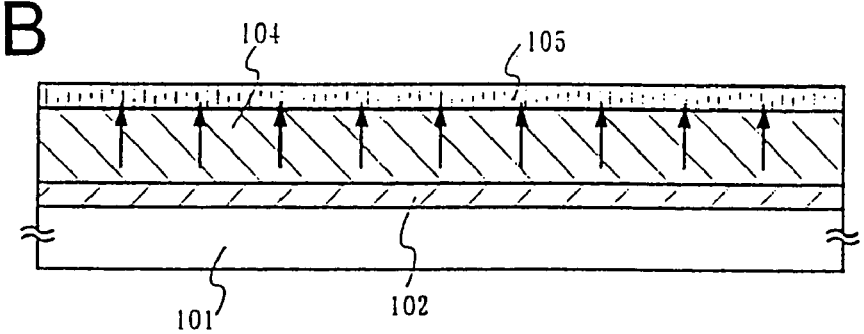

As described above, the crystalline silicon film 104 can be formed on the glass substrate 101. Next, an amorphous silicon film 105 containing a rare gas element is formed on the crystalline silicon film 104, as illustrated in FIG. 1B. Typically, an amorphous silicon film containing $1 \times 10^{19}$ to $1 \times 10^{22}/cm^3$ of argon as the rare gas element is formed by sputtering, so as to have a thickness of 0.05 to 0.1 µm. In the sputtering, highly pure silicon and argon (or argon and hydrogen) are used as a target and a sputtering gas, respectively, to form the amorphous silicon film. In order to incorporate a large amount of argon into the film, it is essential to control the pressure at the time of forming the film. Detailed conditions at this time depend on the used machine. For example, by setting the pressure at this time to 0.2 to 1 Pa and making film-forming speed relatively slow, the argon content can be made large.

Of course, the rare gas element which can be used is not limited to argon. There may be used helium, krypton, neon or xenon. The production method of the amorphous silicon film 105 is not limited to sputtering. Plasma CVD or vapor deposition may be used if this method causes the rare gas element to be incorporated into the silicon film at the same concentration.

Thereafter, an electrically heating furnace is used to conduct heat treatment at 450 to 800° C., preferably at 550° C., in a nitrogen atmosphere for 1 to 4 hours so that the amorphous silicon film 105 containing the rare gas becomes a gettering site. Thus, the concentration of the catalyst element (nickel) contained in the crystalline silicon film 104 can be made to $2 \times 10^{18}$ cm$^3$ or less. At this time, the catalyst element moves in the direction shown by an arrow in FIG. 1B, so as to be concentrated/collected in the amorphous silicon film 105 containing the rare gas element.

In the case that an RTA method is used, a heating lamp source is lighted for 1 to 60 seconds, preferably 30 to 60 seconds. This is repeated 1 to 10 times, preferably 2 to 6 times. The emission intensity of the lamp source may be freely decided; however, the intensity is set in such a manner that the semiconductor film is instantaneously heated up to about 600 to 1000° C., preferably about 700 to 750° C.

Thereafter, the amorphous semiconductor film 105 is etched to be removed. This etching is performed by dry etching using $NF_3$ or $CF_4$, dry etching using $ClF_3$ without using plasma, or wet etching using an alkali solution such as an aqueous solution containing hydrazine or tetraethylammonium hydroxide (chemical formula: $(CH_3)_4NOH$).

Figure 1C:
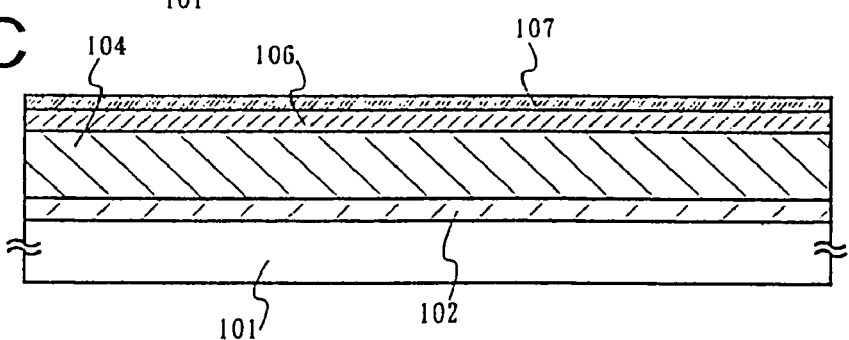
Figure 1D:
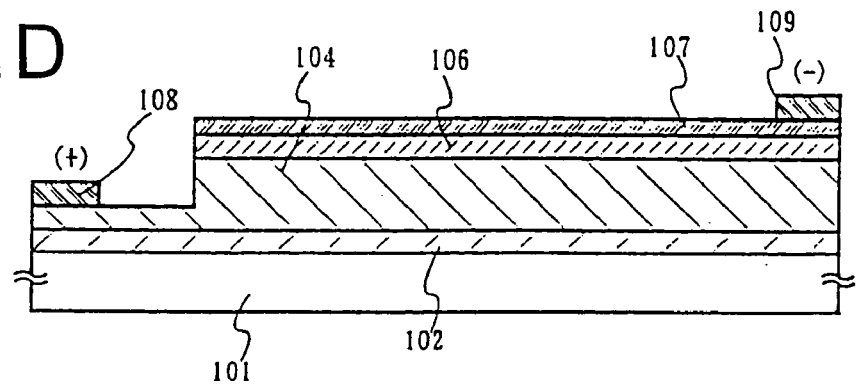

By this etching treatment, the surface of the crystalline silicon film 104 is exposed. An n-type crystalline silicon film 106 is formed on this surface. The n-type crystalline silicon film 106 may be formed by plasma CVD or reduced-pressure thermal CVD. It is advisable to form the n-type crystalline silicon film 106 so as to have a thickness of 0.02 to 0.2 µm, typically a thickness of 0.1 µm. Next, a transparent electrode 107 is formed on the n-type crystalline silicon film 106. As the transparent electrode 107, a film made of an indium tin oxide alloy (ITO) and having a thickness of 0.08 μm is formed by sputtering (FIG. 1C).

Next, lead-out electrodes 108 and 109 are set up. At the time of setting the lead-out electrodes 108 and 109, parts of the transparent electrode 107, the n-type crystalline silicon 105 and the crystalline silicon 103 are removed, as illustrated in FIG. 1E. Metal films made of aluminum, silver or the like are formed by sputtering or vacuum evaporation, to fit a positive electrode 108 onto the crystalline silicon film 104 and fit a negative electrode 109 onto the transparent electrode 107. The lead-out electrodes 108 and 109 can be formed, using aluminum, silver, silver paste or the like.

After the lead-out electrodes 108 and 109 are set up, heat treatment is conducted at 150 to 300° C. for several minutes to improve adhesion between the crystalline silicon film 104 and the silicon oxide film 102 as the undercoat. Thus, good electric properties can be gained Specifically, an oven is preferably used to conduct heat treatment at 200° C. in a nitrogen atmosphere for 30 minutes The above-mentioned process makes it possible to yield a photoelectric conversion device.

Embodiment 2

According to the process for producing a photoelectric conversion device of the present embodiment, in the step of removing the catalyst element for promoting the crystallization of silicon after crystallization, a method of using ion implantation or ion doping is adopted to add a rare gas element into the surface of the crystalline silicon film.

Referring to FIG. 2, a silicon oxide film 202 is formed as an undercoat on a glass substrate 201 to have a thickness of 0.3 μm. This silicon oxide film is formed by plasma CVD using tetramethyl silicate (TEOS) as raw material. This film may be formed by sputtering. Next, silane gas is used as raw material to form an amorphous silicon film 203 by plasma CVD. Next, the workpiece is immersed into ammonium hydrogen peroxide, and kept at 70° C. for 5 minutes, thereby forming an oxide film (not illustrated) on the surface of the amorphous silicon film 203. A solution of acetate nickel is applied onto the surface of the amorphous silicon film 203 by spin coating. The nickel element functions as en element for promoting crystallization of the amorphous silicon film 203.

Next, the workpiece is kept at 450° C. in a nitrogen atmosphere for 1 hour to release hydrogen in the amorphous silicon film 203. In the nitrogen atmosphere, the workpiece is subjected to heat treatment at 550° C. for 4 to 8 hours, to crystallize the amorphous silicon film 203. In this way, a crystalline silicon film 204 is yielded. The steps described above are performed in the same way as in the embodiment 1.

Figure 2A:
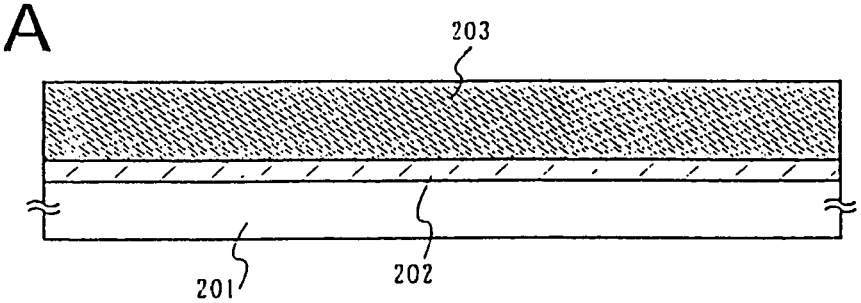
FIGS. 2A to 2D are views which schematically illustrate a process for producing a photoelectric conversion device of the present invention.
Figure 2B:
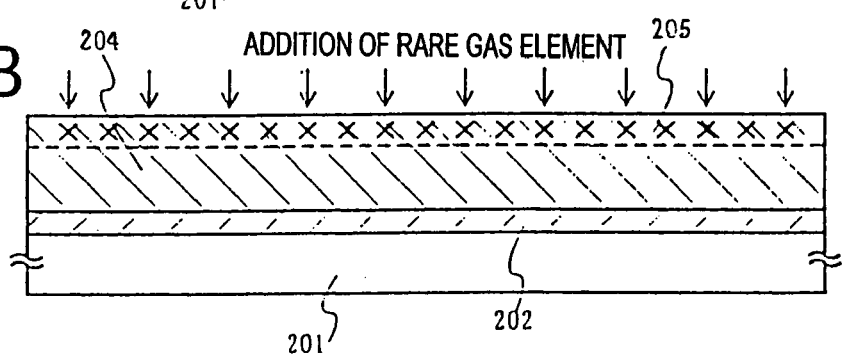

Thereafter, ion doping is used to add a rare gas element to the crystalline silicon film 204. As the rare gas element, argon is used. The dosage thereof is set to $1 \times 10^{14}$ to $1 \times 10^{17}/cm^2$, typically $2 \times 10^{15}/cm^2$, and acceleration voltage is set to 10 keV. By this doping treatment, a region containing argon having a concentration of $1 \times 10^{18}/cm^3$ or more is formed. This region 205 is formed to extend from the surface of the crystalline silicon film 204 to points having a depth of about 0.1 μm (FIG. 2B).

Thereafter, heat treatment is conducted to subject nickel remaining in the crystalline silicon film 204 to gettering. In the case of using an electrically heating furnace, the heat treatment is conducted at 500 to 800° C., preferably 550° C., in a nitrogen atmosphere for 1 to 4 hours. The heat treatment may be performed by an RTA method. The region 205 into which the rare gas element implanted has an amorphous structure wherein the crystal is broken. A strain field is generated in this region 205 by implanting argon, which has a larger atomic diameter than that of silicon, into the region 205. Thus, the region 205 can be made to a gettering site. Following the heat treatment, nickel in the crystalline silicon film 204 moves into this region 205 so that the concentration of the nickel element in the crystalline silicon film 204 can be made to $2 \times 10^{18}/cm^3$ or less.

Figure 6:
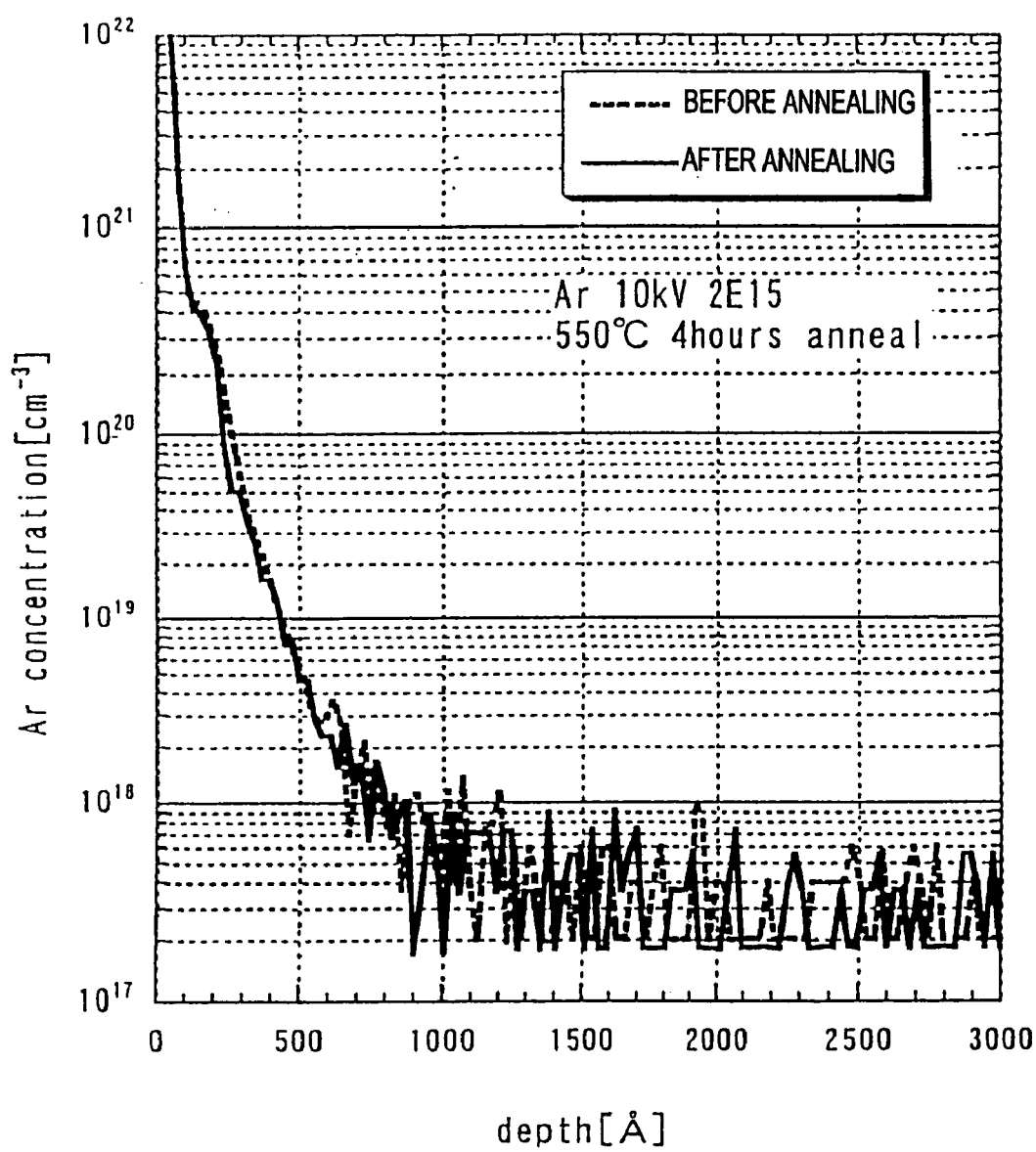
FIG. 6 is a graph showing a concentration distribution of argon added to a crystalline silicon film by ion implantation.

A 100-ppm nickel acetate solution was applied to an amorphous silicon film having a thickness of 300 nm, and then the film was crystallized by heat treatment (i.e., annealing) at 550° C. for 4 hours to yield a crystalline silicon film. A rare gas, argon, was implanted to the crystalline silicon film by ion doping at an acceleration voltage of 10 keV and a dosage of $2 \times 10^{15}/cm^2$. The distribution of argon obtained at this time was measured by secondary ion mass spectrometry The results are shown in FIG. 6. Argon was implanted from the surface of the crystalline silicon film to points having a depth of about 80 nm. The concentration thereof was $1 \times 10^{18}/cm^3$ or more. FIG. 6 also shows a profile after the same sample was subjected to heat treatment at 550° C. for 4 hours. The concentration distribution of argon hardly changed. The argon content in the film did not change. It is therefore understood that argon was not released again outside the film at this temperature. The fact that argon is not distributed again by heat treatment demonstrates that the gettering site can be stably kept, that is, that if the argon-added region is removed, no bad effect is produced on the crystalline silicon film, as will be described later.

Figure 7:
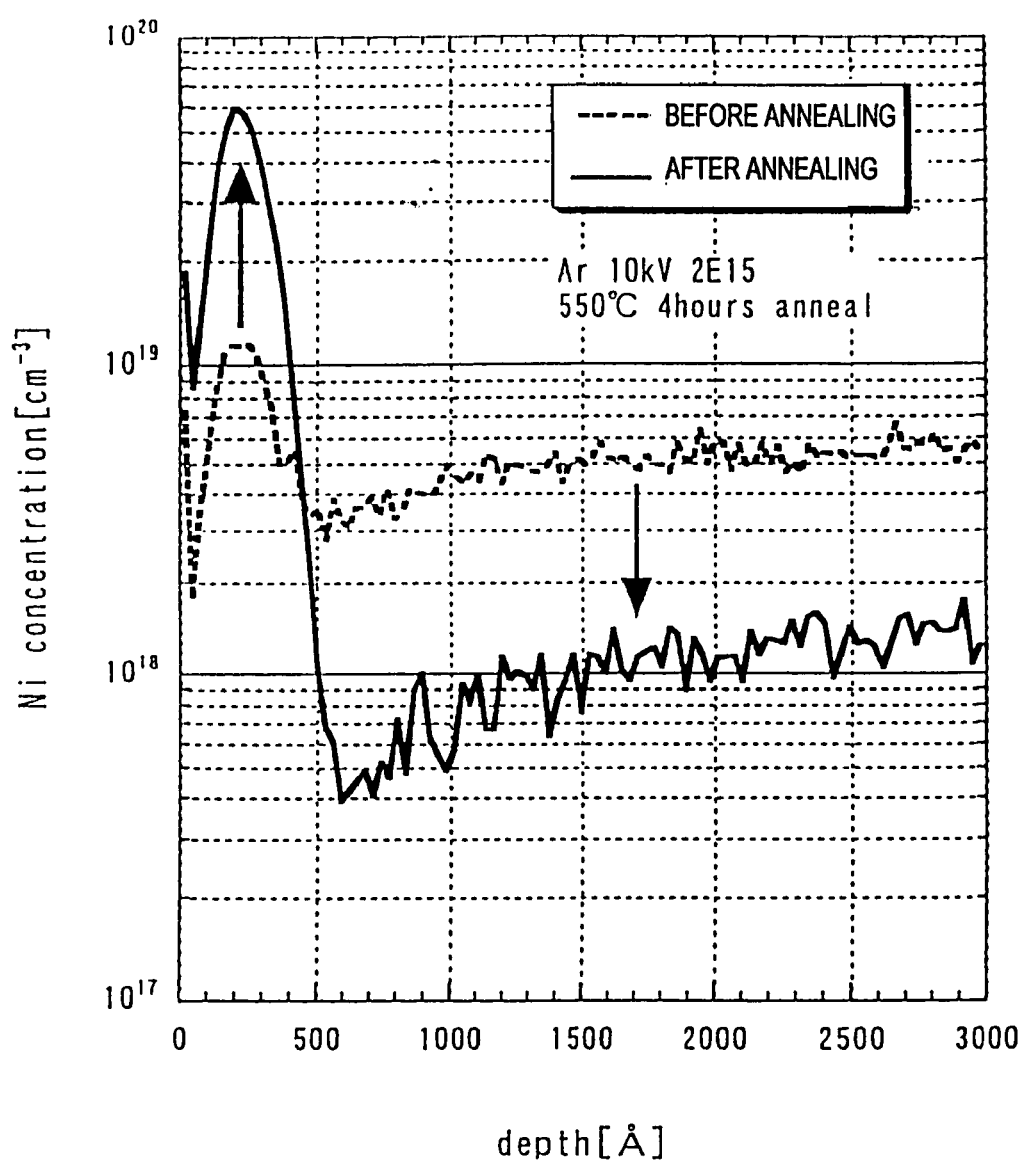
FIG. 7 is a graph showing concentration distributions of nickel added to a crystalline silicon film before and after heat treatment.

FIG. 7 shows data obtained by measuring a nickel concentration distribution in the same sample by secondary ion mass spectrometry. By heat treatment at 550° C. for 4 hours, the nickel concentration of nickel in the film was reduced from $5 \times 10^{18}/cm^3$ to $1 \times 10^{18}/cm^3$. Nickel removed by the reduction moved to the region to which argon was added (the region from the surface of the crystalline silicon film to points having a depth of about 80 nm). The concentration of nickel in this region increased from $1.2 \times 10^{19}/cm^3$ to $6 \times 10^{19}/cm^3$ as the peak value thereof. As described above, the data shown in FIG. 7 clearly demonstrate the effect of the gettering by argon. Of course, such a gettering effect can be produced by not only argon but also any other rare gas elements.

Furthermore, the region 205 to which argon is added at the high concentration is not recrystallized by this heat treatment. Consequently, the strain field remains as it is, so as to be a good site for gettering.

Figure 2C:
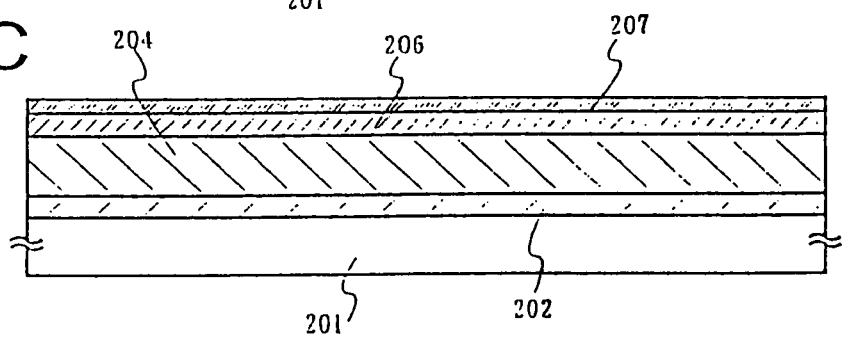

For this reason, in order to complete a photoelectric conversion device, it is necessary to remove the region 205 by etching or the like. The etching may be performed in the same way as in the embodiment 1. From the crystalline silicon film 204, a region extending from the surface thereof to points having a depth of about 0.1 μm is removed and subsequently an n-type crystalline silicon film 206 is formed. The film 206 may be formed by plasma CVD or reduced-pressure thermal CVD. The thickness of the film 206 is preferably set to 0.02 to 0.2 μm, and is typically set to 0.1 μm. Furthermore, a transparent electrode 207 is formed. As the transparent electrode 207, a film made of an indium tin oxide alloy (ITO) and having a thickness of 0.08 μm is formed by sputtering (FIG. 2C).

Figure 2D:
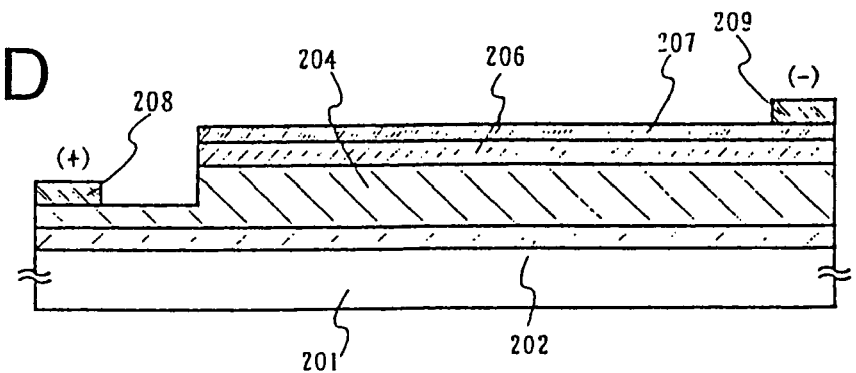

In order to form lead-out electrodes 208 and 209, parts of the transparent electrode 207, the n-type crystalline silicon 206 and the crystalline silicon 204 are removed, as illustrated in FIG. 2D to expose parts of the surface of the crystalline silicon film 204. Metal films made of aluminum, silver or the like are formed by sputtering or vacuum evaporation, to fit a positive electrode 208 onto the crystalline silicon film 204 and fit a negative electrode 209 onto the transparent electrode 207.

After the lead-out electrodes 208 and 209 are set up, heat treatment is conducted at 150 to 300° C. for several minutes to improve adhesion between the crystalline silicon film 204 and the silicon oxide film 202 as the undercoat. Thus, good electric properties can be gained. In the present embodiment, an oven is used to conduct heat treatment at 200° C. in a nitrogen atmosphere for 30 minutes. The above-mentioned process makes it possible to yield a photoelectric conversion device.

Embodiment 3

The following will describe an embodiment wherein an amorphous silicon film formed as a gettering site on a crystalline silicon film formed using a catalyst element is selectively removed.

Figure 5A:
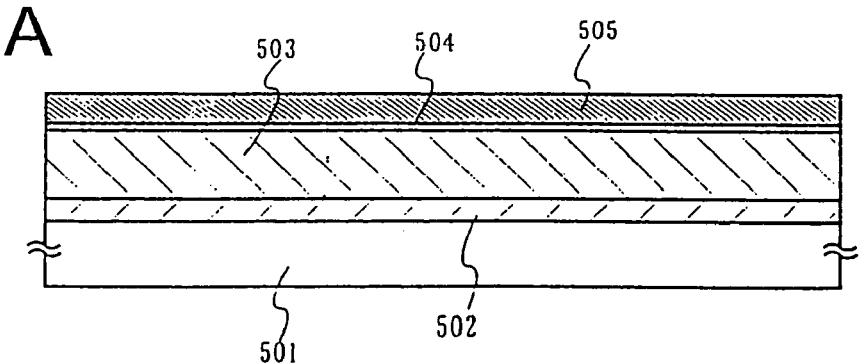
FIGS. 5A to 5C are views which schematically illustrate a process for producing a photoelectric conversion device of the present invention.

Referring to FIG. 5A, a silicon oxide film 502 is formed as an undercoat on a glass substrate 501 in the same way as in the embodiment 1, so as to have a thickness of 0.3 μm. Next, an amorphous silicon film is made from silane gas as raw material by plasma CVD, and then a catalyst element is introduced thereto so as to crystallize the amorphous silicon film. In this way, a crystalline silicon film 503 is formed. The steps described above are performed in the same way as in the embodiment 1.

Next, a barrier layer 504 is formed on the surface of the crystalline silicon film 503. To form the barrier layer, a chemical oxide produced by treatment with ozone water may be used. The chemical oxide may also be produced by treatment with an aqueous solution wherein hydrogen peroxide water is mixed with sulfuric acid, hydrochloric acid, nitric acid or the like. In a different method, the chemical oxide may be produced by plasma treatment in an oxidizing atmosphere or oxidizing treatment with ozone generated by radiation of ultraviolet rays in an oxygen-containing atmosphere. Alternatively, the crystalline silicon film may be heated at 200 to 350° C. in a clean oven to form a thin oxidized film as the barrier layer, or an oxidized film having a thickness of 1 to 5 nm is deposited as the barrier layer by plasma CVD, sputtering or vapor deposition.

Thereafter, an amorphous silicon film 505 containing a rare gas element is formed on the barrier layer 504. This film may be formed in the same way as in the embodiment 1. Alternatively, after the formation of an amorphous silicon film, the rare gas element may be added thereto by ion implantation or ion doping, as described in the above-mentioned item [Embodiment 2]. This amorphous silicon film 505 is used as a gettering site.

In order to subject the catalyst element remaining in the crystalline silicon film 503 to gettering, heat treatment is conducted. The heat treatment is conducted at 500 to 800° C., preferably 550° C., in a nitrogen atmosphere for 1 to 4 hours. In the case that an RTA method is used, a heating lamp source is lighted for 1 to 60 seconds, preferably 30 to 60 seconds. This is repeated 1 to 10 times, preferably 2 to 6 times. The emission intensity of the lamp source may be freely decided; however, the intensity is set in such a manner that the semiconductor film is instantaneously heated up to about 600 to 1000° C., preferably about 700 to 750° C.

Thereafter, the amorphous silicon film 505 is selectively etched to be removed. This etching is performed by dry etching using ClF$_3$ without the use of plasma, or wet etching using an alkali solution such as an aqueous solution containing hydrazine or tetraethylammonium hydroxide (chemical formula: $(CH_3)_4NOH$). At this time, the barrier layer 504 functions as an etching stopper. Thereafter, the barrier layer 504 should be removed with hydrofluoric acid.

In this way, the catalyst element in the crystalline silicon film 503 is subjected to gettering into the amorphous silicon film 505 to which the rare gas element is added, so as to make it possible to set the concentration of the catalyst element in the crystalline silicon film 503 to $2 \times 10^{18}/cm^3$ or less.

Figure 5B:
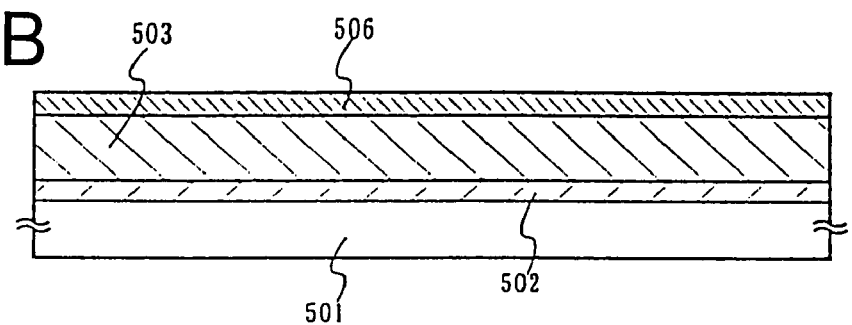

An n-type crystalline silicon film 506 is formed on the surface thereof. This film 506 may be formed by plasma CVD or reduced-pressure thermal CVD. The thickness of the film 506 is set to 0.02 to 0.2 μm. Next, as a transparent electrode 507, a film made of an indium tin oxide alloy (ITO) and having a thickness of 0.08 μm is formed on the n-type crystalline silicon film 506 by sputtering (FIG. 5B).

Figure 5C:
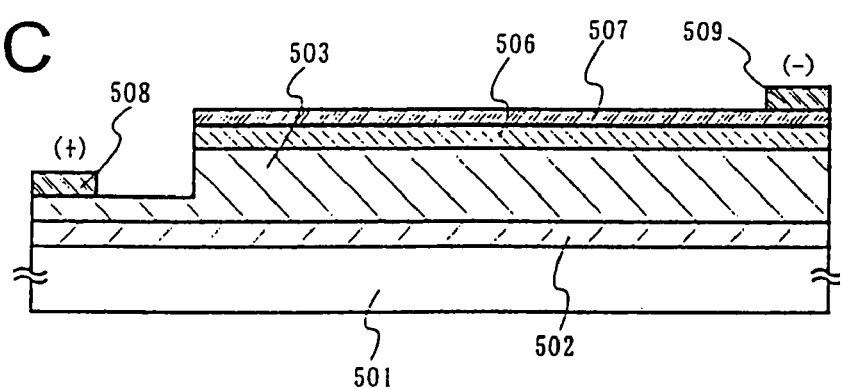

Furthermore, lead-out electrodes 508 and 509 are set up. At the time of setting the lead-out electrodes 508 and 509, parts of the transparent electrode 507, the n-type crystalline silicon film 506 and the crystalline silicon film 503 are removed, as illustrated in FIG. 5C. Metal films made of aluminum, silver or the like are formed by sputtering or vacuum evaporation, to fit a positive electrode 508 onto the crystalline silicon film 503 and fit a negative electrode 509 onto the transparent electrode 507. The lead-out electrodes 508 and 509 can be formed, using aluminum, silver, silver paste or the like.

After the lead-out electrodes 508 and 509 are set up, heat treatment is conducted at 150 to 300° C. for several minutes to improve adhesion between the crystalline silicon film 503 and the silicon oxide film 502 as the undercoat. Thus, good electric properties can be gained. In the present embodiment, an oven is used to conduct heat treatment at 200° C. in a nitrogen atmosphere for 30 minutes. The above-mentioned process makes it possible to complete a photoelectric conversion device. The present embodiment may be combined with the embodiment 1 or embodiment 2.

Embodiment 4

The following will describe, as the present embodiment, an embodiment wherein the surface of the crystalline silicon film is subjected to anisotropic etching in the process for producing the photoelectric conversion device described as the embodiment 1, 2 or 3, so as to make 1-layer in the photoelectric conversion device uneven. The technique wherein the surface is made uneven to reduce the surface reflection of the photoelectric conversion device is called texture treatment.

A silicon oxide film is formed as an undercoat 302 on a glass substrate 301 (for example, a Corning 7959 glass substrate) to have a thickness of 0.3 μm. This silicon oxide film is formed by plasma CVD using tetramethyl silicate (TEOS) as raw material. This film may be formed by sputtering. Next, an amorphous silicon film is formed by plasma CVD. This amorphous silicon film may be formed by reduced-pressure thermal CVD, sputtering or vacuum evaporation as well as plasma CVD. The amorphous silicon film may be a substantially intrinsic amorphous silicon film, or an amorphous silicon film to which 0.001 to 0.1 atomic percent of boron (B) is added. The thickness of the amorphous silicon film 103 is set to 20 μm. Of course, this thickness may be changed to a desired thickness.

The workpiece is subjected to heat treatment to form a crystalline silicon film 303. In the crystalline silicon film 303, the concentration of the catalyst element introduced in the step of the crystallization is reduced to $2\times10^{18}/cm^3$ or less by the gettering treatment of the present invention.

After the gettering treatment, the surface of the crystalline silicon film 303 is subjected to a texture treatment. The texture treatment can be conducted using an aqueous solution of sodium hydroxide, or hydrazine. The following will describe a case in which sodium hydroxide is used.

The texture treatment is conducted by heating an aqueous solution having a sodium hydroxide concentration of 2% to 80° C. Under this condition, the etching rate of the crystalline silicon film 303 used in the present embodiment can be about 1 μm/minute. The etching is performed for 5 minutes. Thereafter, the workpiece is immersed into boiling water in order to stop the reaction instantaneously. Furthermore, the workpiece is sufficiently washed with flowing water. When the surface of the crystalline silicon film 303 after the texture treatment is observed with an electron microscope, irregularities, which are arranged at random and have a height of about 0.1 to 5 μm, can be observed.

Figure 3:
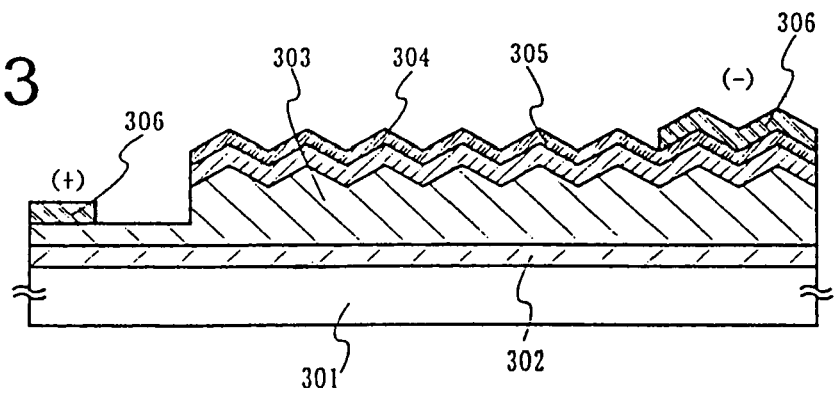
FIG. 3 is a sectional view which illustrates an example of the photoelectric conversion device of the present invention.

Next, a transparent electrode 305 is formed on the n-type crystalline silicon film 304. As the transparent electrode 305, a film made of an indium tin oxide alloy (ITO) and having a thickness of 0.08 μm is formed by sputtering. Finally, lead-out electrodes are fitted up In order to fit up the lead-out electrodes, parts of the transparent electrode, n-type crystalline silicon and the crystalline silicon film 303 are removed and subsequently a negative electrode 306 is set up on the transparent electrode 304 and a positive electrode 306 is set up on the crystalline silicon film 303, as illustrated in FIG. 3. The lead-out electrodes 306 may be formed by sputtering or vacuum evaporation using aluminum, silver, silver paste or the like. After the electrodes 306 are fitted up, the workpiece is subjected to heat treatment at 150 to 300° C. for several minutes to improve adhesion between the crystalline silicon film 303 and the under coat 302. Thus, good electric properties can be gained. In the present embodiment, an oven is used to conduct heat treatment at 200° C. in a nitrogen atmosphere for 30 minutes. The above-mentioned process makes it possible to yield a photoelectric conversion device having, in the surface thereof, a texture structure. The present embodiment may be freely combined with the embodiment 1, 2 or 3.

Embodiment 5

Figure 4:
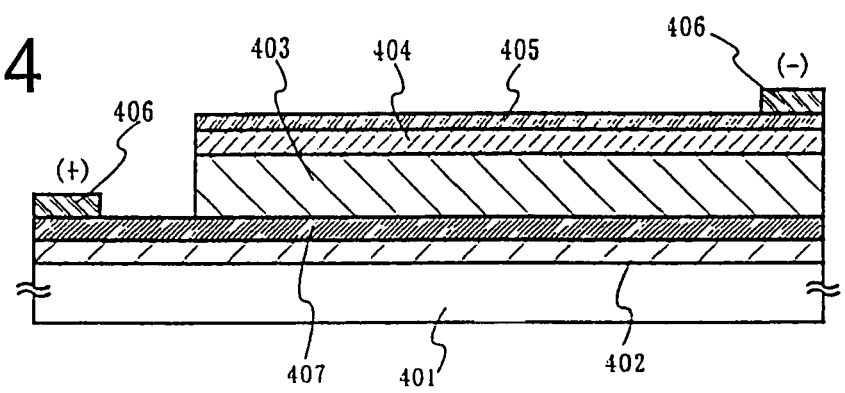
FIG. 4 is a sectional view which illustrates an example of the photoelectric conversion device of the present invention.

The following will describe, as the present embodiment, a technique of forming a coating film made of a catalyst element for promoting the crystallization of silicon, forming an amorphous silicon film closely onto the coating film made of the catalyst element, crystallizing the amorphous silicon film by heat treatment, and subsequently removing the catalyst element diffused into the resultant crystalline silicon film to produce a photoelectric conversion device, referring to FIG. 4.

First, a coating film made of a catalyst element for promoting the crystallization of silicon is formed on a substrate. As the catalyst element, nickel is typically used. A silicon oxide film having a thickness of 0.3 μm is firstly formed as an undercoat 402 on a glass substrate (for example, a Corning 7059 glass substrate) 401. This silicon oxide film is formed by plasma CVD using tetramethyl silicate (TEOS) as raw material. This film may be formed by sputtering. Next, a nickel film 407 is formed on this substrate. The nickel film is formed by electron beam vacuum evaporation using a tablet made of pure nickel, so as to have a thickness of 0.1 μm. Next, an amorphous silicon film is formed by plasma CVD. The formation of the amorphous silicon film may be performed using reduced-pressure thermal CVD, sputtering or vacuum evaporation as well as plasma CVD. The amorphous silicon film 103 may be a pure amorphous silicon film to which no element of the 13 or 15 group in the periodic table is added, or an amorphous silicon film to which 0.001 to 0.1 atomic percent of boron (B) is added. The thickness of the amorphous silicon film is set to 10 μm. Of course, this thickness may be changed to a desired thickness.

Next, the workpiece is kept at a temperature of 450° C. in a nitrogen atmosphere for 1 hour to release hydrogen in the amorphous silicon film. This is performed to lower the threshold energy for subsequent crystallization by forming dangling bonds (unpaired bonding hands) intentionally in the amorphous silicon film. Thereafter, the workpiece is subjected to heat treatment at 550° C. in the nitrogen atmosphere for 4 to 8 hours, so as to crystallize the amorphous silicon film. In this way, a crystalline silicon film 403 is yielded. Because of the catalyst action of nickel, the temperature for this crystallization can be made to 550° C. This resultant crystalline silicon film 403 contains 0.001 to 5 atomic percentage of hydrogen. The nickel element diffuses partially from the nickel film 407 to the silicon film, so that the crystallization advances. In this way, the crystalline silicon film can be formed over the glass substrate.

Thereafter, a gettering site is formed to perform gettering. The gettering site may be composed of an amorphous silicon film containing a rare gas element, or a region to which a rare gas is implanted inside the crystalline silicon film 403. Thereafter, the workpiece is subjected to heat treatment to perform gettering. The gettering site which has been unnecessary is removed by etching.

In this way, the surface of the crystalline silicon film 403 is exposed over the main surface of the substrate 401. An n-type crystalline silicon film 404 is formed on this surface. Next, as a transparent electrode 405, a film made of an indium tin oxide alloy (ITO) and having a thickness of 0.08 μm is formed on the n-type crystalline silicon film 404 by sputtering. Finally, lead-out electrodes 406 are fitted up to complete a photoelectric conversion device. The embodiment of the present embodiment may be freely combined with the embodiment 1, 2, 3 or 4.

Embodiment 6

Referring to FIG. 1, the following will describe, as the present embodiment, a photoelectric conversion device wherein a p-type semiconductor layer is positioned at the incident side of light, which is different from the embodiment 1.

Referring to FIG. 1, a silicon oxide film 102 as an undercoat and an amorphous silicon film 103 are firstly formed on a stainless steel substrate 101. The amorphous silicon film 103 may be an intrinsic amorphous silicon film to which an element of the 13 or 15 group in the periodic table is not intentionally added, or an amorphous silicon film to which 0.001 to 0.1 atomic percent of phosphorus (P) is added. The thickness of the amorphous silicon film 103 is set to 1–20 μm, preferably 5–10 μm (FIG. 1A).

Next, an oxidized film (not illustrated) is formed on the surface of the amorphous silicon film 103, and a nickel acetate solution is applied onto the surface of the amorphous silicon film 103 by spin coating, so as to disperse nickel, which will be a catalyst element, into the surface of the amorphous silicon film 103.

Next, the workpiece is kept at a temperature of 450° C. in a nitrogen atmosphere for 1 hour, to release hydrogen in the amorphous silicon film 103. Thereafter, the workpiece is subjected to heat treatment at 500 to 600° C., preferably at 550° C., in the nitrogen atmosphere for 4 to 8 hours, to crystallize the amorphous silicon film 103. In this way, a crystalline silicon film 104 is formed.

As described above, the crystalline silicon film 104 can be formed on the stainless steel substrate 101., Next, an amorphous silicon film 105 containing a rare gas element is formed on the amorphous silicon film 104, as illustrated in FIG. 1B.

Thereafter, an electrically heating furnace is used to conduct heat treatment at 450 to 800° C., preferably at 550° C., in a nitrogen atmosphere for 1 to 4 hours so that the amorphous silicon film 105 containing the rare gas element becomes a gettering site. Thus, the concentration of the catalyst element (nickel) contained in the crystalline silicon film 104 can be made to $2 \times 10^{18}$ cm$^3$ or less. At this time, the catalyst element moves in the direction shown by an arrow in FIG. 1B, so as to be concentrated/collected in the amorphous silicon film 105 containing the rare gas element.

Thereafter, the amorphous semiconductor film 105 is etched to be removed. This etching is performed by dry etching using $NF_3$ or $CF_4$, dry etching using $ClF_3$ without the use of plasma, or wet etching using an alkali solution such as an aqueous solution containing hydrazine or tetraethylammonium hydroxide (chemical formula: $(CH_3)_4NOH$).

By this etching treatment, the surface of the crystalline silicon film 104 is exposed. A p-type crystalline silicon film 106 is formed on this surface. The p-type crystalline silicon film 106 may be formed by plasma CVD or reduced-pressure thermal CVD. It is advisable to form the p-type crystalline silicon film 106 so as to have a thickness of 0.02 to 0.2 μm, typically a thickness of 0.1 μm. Next, a transparent electrode 107 is formed on the p-type crystalline silicon film 106. As the transparent electrode 107, a film made of an indium tin oxide alloy (ITO) and having a thickness of 0.08 μm is formed by sputtering (FIG. 1C).

Finally, lead-out electrodes 108 and 109 are fitted up. If necessary, the workpiece is subjected to heat treatment at 150 to 300° C. for several minutes, so as to complete a photoelectric conversion device wherein light is radiated onto the side of the p-type crystalline silicon film.

Embodiment 7

If a p-type crystalline silicon film is formed instead of the n-type crystalline silicon film 206 in the embodiment 2 described with reference to FIG. 2, a photoelectric conversion device wherein light is radiated onto the side of the p-type crystalline silicon film can be produced.

In the process for producing a photoelectric conversion device according to the present invention, a crystalline silicon film can be obtained at a lower heat treatment temperature than in the prior art by using a catalyst material such as nickel in the step of subjecting an amorphous silicon film to heat treatment so as to be crystallized. Additionally, the concentration of the catalyst material remaining in the resultant crystalline silicon film can be reduced. As a result, it is possible to obtain a photoelectric conversion device using an inexpensive glass substrate and exhibiting a superior photoelectric conversion characteristic.

Furthermore, a second semiconductor film to which a rare gas element is added so as to generate a strain field is used as a gettering site. In the photoelectric conversion device, therefore, its layer at the incident side of light can be made to an n-type semiconductor layer, or can be made to a p-type semiconductor layer. Thus, even if a nontransparent substrate such as a stainless steel substrate is used, the layer at the light-incident side can be freely selected from both of n-type and p-type semiconductor layers.

What is claimed is:

1. A process for producing a semiconductor device, comprising:
   forming a first semiconductor film having an amorphous structure;
   adding an element for promoting crystallization to the first semiconductor film having the amorphous structure;
   conducting a first heat treatment to form a first semiconductor film having a crystal structure;
   forming a second semiconductor film containing a rare gas element over the first semiconductor film having the crystal structure;
   conducting a second heat treatment to segregate the element for promoting crystallization into the second semiconductor film; and
   removing the second semiconductor film,
   wherein the second heat treatment is conducted by radiation from one or more selected from a halogen lamp, a metal halide lamp, a xenon arc lamp, a carbon arc lamp, a high-pressure sodium lamp, or a high-pressure mercury lamp in order that the first semiconductor film is heated at 700° C. or more.

2. A process according to claim 1, wherein the second semiconductor film is formed by sputtering.

3. A process according to claim 1, wherein the second semiconductor film is formed by plasma CVD.

4. A process according to claim 1, wherein the first heat treatment is conducted by radiation from one or more selected from a halogen lamp, a metal halide lamp, a xenon arc lamp, a carbon arc lamp, a high-pressure sodium lamp, or a high-pressure mercury lamp.

5. A process according to claim 1, wherein the first heat treatment is conducted by furnace annealing using an electrical heating furnace.

6. A process according to claim 1, wherein the second heat treatment up to 1000° C.

7. A process according to claim 1, wherein the rare gas element is one or more selected from He, Ne, Ar, Kr and Xe.

8. A process according to claim 1, wherein the element for promoting crystallization is one or more selected from Fe, Ni, Co, Ru, Rh, Pd, Os, Ir, Pt, Cu and Au.

9. A process for producing a semiconductor device, comprising:
   forming a first semiconductor film having an amorphous structure;
   adding an element for promoting crystallization to the first semiconductor film having the amorphous structure;
   conducting a first heat treatment to form a first semiconductor film having a crystal structure;
   forming a barrier layer over a surface of the first semiconductor film having the amorphous structure;
   forming a second semiconductor film containing a rare gas element over the barrier layer,
   conducting a second heat treatment to segregate the element for promoting crystallization into the second semiconductor film, and
   removing the second semiconductor film,
   wherein the second heat treatment is conducted by radiation from one or more selected from a halogen lamp, a metal halide lamp, a xenon arc lamp, a carbon arc lamp, a high-pressure sodium lamp, or a high-pressure mercury lamp in order that the first semiconductor film is heated at 700° C.

10. A process according to claim 9, wherein the second semiconductor film is formed by sputtering.

11. A process according to claim 9, wherein the second semiconductor film is formed by plasma CVD.

12. A process according to claim 9, wherein the barrier layer comprises a chemical oxide film formed using ozone water.

13. A process according to claim 9, wherein the barrier layer is formed by oxidizing the surface of the first semiconductor film having the crystal structure by plasma treatment.

14. A process according to claim 9, wherein the barrier layer is formed by oxidizing the surface of the first semiconductor film having the crystal structure with ozone generated by radiation of ultraviolet rays in an atmosphere containing oxygen.

15. A process according to claim 9, wherein the first heat treatment is conducted by radiation from one or more selected from a halogen lamp, a metal halide lamp, a xenon arc lamp, a carbon arc lamp, a high-pressure sodium lamp, or a high-pressure mercury lamp.

16. A process according to claim 9, wherein the first heat treatment is conducted by furnace annealing using an electrical heating furnace.

17. A process according to claim 9, wherein the second heat treatment is conducted up to 1000° C.

18. A process according to claim 9, wherein the rare gas element is one or more selected from He, Ne, Ar, Kr and Xe.

19. A process according to claim 9, wherein the element for promoting crystallization is one or more selected from Fe, Ni, Co, Ru, Rh, Pd, Os, Ir, Pt, Cu and Au.

20. A process for producing a semiconductor device, comprising:
  forming a first semiconductor film having an amorphous structure;
  adding an element for promoting crystallization to the first semiconductor film having the amorphous structure;
  conducting a first heat treatment to form a first semiconductor film having a crystal structure;
  forming a second semiconductor film over the first semiconductor film having the crystal structure;
  adding a rare gas element to the second semiconductor film;
  conducting a second heat treatment to segregate the element for promoting crystallization into the second semiconductor film, and
  removing the second semiconductor film,
  wherein the second heat treatment is conducted by radiation from one or more selected form a halogen lamp, a metal halide lamp, a xenon arc lamp, a carbon arc lamp, a high-pressure sodium lamp, or a high-pressure mercury lamp in order that the first semiconductor film is heated at 700° C. or more.

21. A process according to claim 20, wherein the rare gas element is added by ion implantation or ion doping.

22. A process according to claim 20, wherein the first heat treatment is conducted by radiation from one or more selected from a halogen lamp, a metal halide lamp, a xenon arc lamp, a carbon arc lamp, a high-pressure sodium lamp, or a high-pressure mercury lamp.

23. A process according to claim 20, wherein the first heat treatment is conducted by furnace annealing using an electrical heating furnace.

24. A process according to claim 20, wherein the second heat treatment is conducted up to 1000° C.

25. A process according to claim 20, wherein the rare gas element is one or more selected from He, Ne, Ar, Kr and Xe.

26. A process according to claim 20, wherein the element for promoting crystallization is one or more selected from Fe, Ni, Co, Ru, Rh, Pd, Os, Ir, Pt, Cu and Au.

27. A process for producing a semiconductor device, comprising:
  forming a first semiconductor film having an amorphous structure;
  adding an element for promoting crystallization to the first semiconductor film having the amorphous structure;
  conducting a first heat treatment to form a first semiconductor film having a crystal structure;
  forming a barrier layer over a surface of the first semiconductor film having the crystal structure;
  forming a second semiconductor film over the barrier layer;
  adding a rare gas element to the second semiconductor film;
  conducting a second heat treatment to segregate the element for promoting crystallization into the second semiconductor film; and
  removing the second semiconductor film,
  wherein the second heat treatment is conducted by radiation from one or more selected from a halogen lamp, a metal halide lamp, a xenon arc lamp, a carbon arc lamp, a high-pressure sodium lamp, or a high-pressure mercury lamp in order that the first semiconductor film is heated at 700° C. or more.

28. A process according to claim 27, wherein the rare gas element is added by ion implantation or ion doping.

29. A process according to claim 27, wherein the barrier layer comprises a chemical oxide film formed using ozone water.

30. A process according to claim 27, wherein the barrier layer is formed by oxidizing the surface of the first semiconductor film having the crystal structure by plasma treatment.

31. A process according to claim 27, wherein the barrier layer is formed by oxidizing the surface of the first semiconductor film having the crystal structure with ozone generated by radiation of ultraviolet rays in an atmosphere containing oxygen.

32. A process according to claim 27, wherein the first heat treatment is conducted by radiation from one or more selected from a halogen lamp, a metal halide lamp, a xenon arc lamp, a carbon arc lamp, a high-pressure sodium lamp, or a high-pressure mercury lamp.

33. A process according to claim 27, wherein the first heat treatment is conducted by furnace annealing using an electrical heating furnace.

34. A process according to claim 27, wherein the second heat treatment is conducted up to 1000° C.

35. A process according to claim 27, wherein the rare gas element is one or more selected from He, Ne, Ar, Kr and Xe.

36. A process according to claim 27, wherein the element for promoting crystallization is one or more selected from Fe, Ni, Co, Ru, Rh, Pd, Os, Ir, Pt, Cu and Au.

37. A process for producing a semiconductor device, comprising:
  forming a first semiconductor film having an amorphous structure;
  adding an element for promoting crystallization to the first semiconductor film having the amorphous structure;

conducting a first heat treatment to form a first semiconductor film having a crystal structure;

forming a second semiconductor film over the first semiconductor film having the crystal structure, wherein a rare gas element is added to the second semiconductor film;

conducting a second heat treatment to segregate the element for promoting crystallization into the second semiconductor film; and removing the second semiconductor film, wherein the second heat treatment is conducted by radiation from one or more selected from a halogen lamp, a metal halide lamp, a xenon arc lamp, a carbon arc lamp, a high-pressure sodium lamp, or a high-pressure mercury lamp in order that the first semiconductor film is heated at 700° C. or more.

38. A process according to claim 37, further comprising forming a barrier layer over a surface of the first semiconductor film having the crystal structure.

39. A process according to claim 37, wherein the second heat treatment is conducted up to 1000° C.

* * * * *